(12) United States Patent
Siebert et al.

(10) Patent No.: US 12,241,154 B2
(45) Date of Patent: Mar. 4, 2025

(54) HOLDING SYSTEM FOR HOLDING SUBSTRATES DURING A PROCESSING OF THE SURFACES OF THE SUBSTRATES

(71) Applicant: Oerlikon Surface Solutions AG, Pfäffikon, Pfäffikon (CH)

(72) Inventors: Max Siebert, Bolanden (DE); Jens Eggemann, Bad Kreuznach (DE); Christian Becker, Bingen (DE); Dieter Mueller, Bingen am Rhein (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 246 days.

(21) Appl. No.: 17/786,795

(22) PCT Filed: Dec. 16, 2020

(86) PCT No.: PCT/EP2020/086504
§ 371 (c)(1),
(2) Date: Jun. 17, 2022

(87) PCT Pub. No.: WO2021/122805
PCT Pub. Date: Jun. 24, 2021

(65) Prior Publication Data
US 2023/0026860 A1    Jan. 26, 2023

(30) Foreign Application Priority Data
Dec. 19, 2019 (DE) ...................... 10 2019 135 183.9

(51) Int. Cl.
C23C 14/50 (2006.01)
C23C 14/56 (2006.01)
(Continued)

(52) U.S. Cl.
CPC ............ *C23C 14/50* (2013.01); *C23C 14/562* (2013.01); *C23C 16/4587* (2013.01); *C23C 16/545* (2013.01)

(58) Field of Classification Search
CPC .... C23C 14/50; C23C 14/562; C23C 16/4587
See application file for complete search history.

(56) References Cited

U.S. PATENT DOCUMENTS 4,473,455 A * 9/1984 Dean ................. H01L 21/68728
  118/503
4,485,759 A    12/1984 Branddolf
(Continued)

FOREIGN PATENT DOCUMENTS

CN    107000146 A    8/2017
CN    107430977 A    12/2017
(Continued)

OTHER PUBLICATIONS

Second Office Action for Chinese Application No. 202080095993.9 mailed Jun. 20, 2024, with its English translation, 29 pages.
(Continued)

*Primary Examiner* — Seahee Hong
(74) *Attorney, Agent, or Firm* — Christian S. Hans; Bret E. Field; Bozicevic, Field & Francis LLP

(57) ABSTRACT

The invention relates to a holding system (1) for holding substrates (12) for use in a surface processing system having a covering area (20), comprising a plurality of fixing elements (2), a body (24) arranged within the covering area (20) for receiving the fixing elements (2), and a positioning element (26) for adjusting the covering and a machining area (20, 22), wherein a plurality of substrates (12) can be fixed by the fixing elements (2) and processed within the machining area (22).

19 Claims, 5 Drawing Sheets

Figure 1:
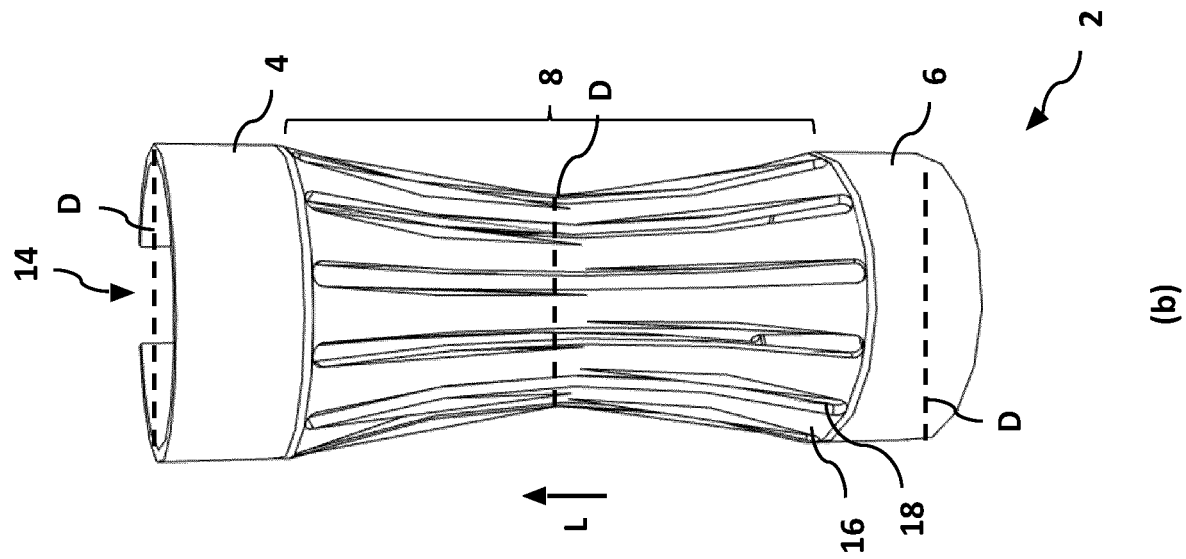
Figure 1:
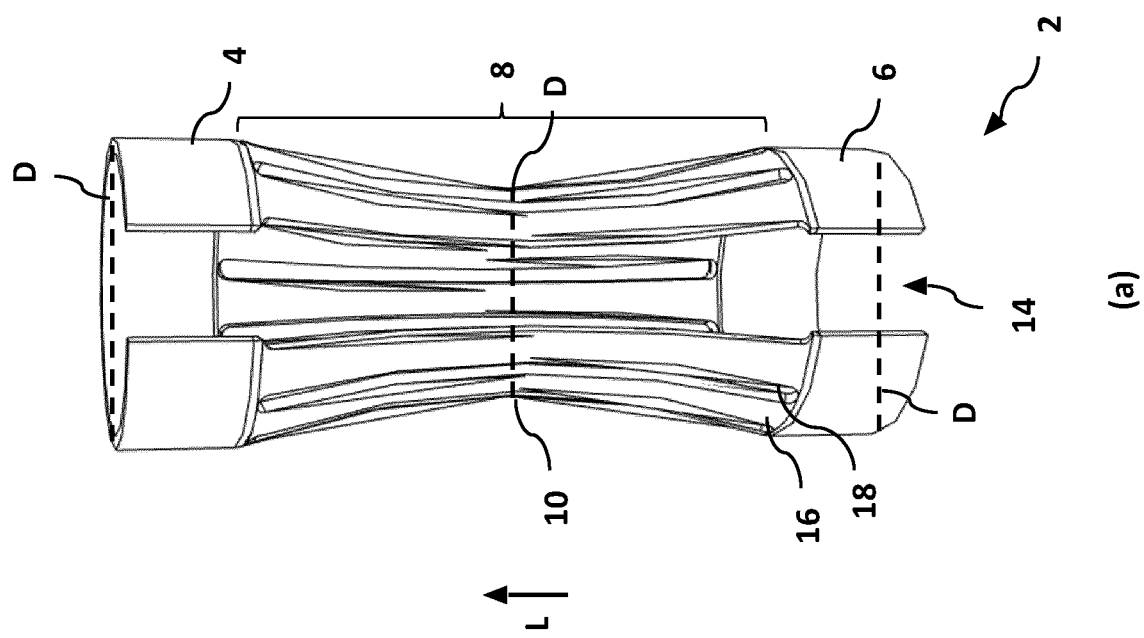

(51) Int. Cl.
*C23C 16/458* (2006.01)
*C23C 16/54* (2006.01)

(56) References Cited

U.S. PATENT DOCUMENTS

| | | | |
|---|---|---|---|
| 6,083,322 A * | 7/2000 | Burns | C23C 14/50 |
| | | | 118/730 |
| 6,866,889 B1 | 3/2005 | Lill et al. | |
| 7,026,015 B2 | 4/2006 | Kreuzer | |
| 7,837,843 B2 * | 11/2010 | Sharp | C23C 14/505 |
| | | | 118/500 |
| 8,323,409 B2 * | 12/2012 | Schlichting | C23C 14/042 |
| | | | 118/721 |
| 9,789,513 B2 | 10/2017 | Feuerstein et al. | |
| 11,131,024 B2 | 9/2021 | Kim et al. | |
| D944,617 S * | 3/2022 | Khatri | D8/71 |
| 11,590,528 B2 | 2/2023 | Vogel et al. | |
| 2003/0015136 A1 | 1/2003 | Giacri et al. | |
| 2011/0283944 A1* | 11/2011 | Yoshimoto | C23C 16/325 |
| | | | 118/728 |
| 2013/0149450 A1* | 6/2013 | Feuerstein | C23C 14/042 |
| | | | 118/500 |
| 2013/0177707 A1* | 7/2013 | Feuerstein | B05C 13/02 |
| | | | 118/500 |
| 2017/0282316 A1 | 10/2017 | Schmieder et al. | |

FOREIGN PATENT DOCUMENTS

| | | |
|---|---|---|
| CN | 110312820 A | 10/2019 |
| DE | 3401815 A1 * | 7/1984 |
| DE | 212989 A1 * | 8/1984 |
| DE | 60002579 T2 | 4/2004 |
| DE | 202014100933 U1 | 6/2015 |
| EP | 1256637 A1 | 11/2002 |
| EP | 2952439 A1 | 12/2015 |
| JP | 2008-260973 A | 10/2008 |
| KR | 10-2013-0115828 A | 10/2013 |
| WO | WO2003034419 A1 | 4/2003 |
| WO | WO2013086286 A2 | 6/2013 |
| WO | WO2018149548 A1 | 8/2018 |
| WO | WO2019053254 A1 | 3/2019 |

OTHER PUBLICATIONS

Search Report for German Application No. 10 2019 135 183.9 mailed Jul. 31, 2020, with its English translation, 9 pages.
International Preliminary Report on Patentability for PCT Application No. PCT/EP2020/086504 mailed May 17, 2022, with its English translation, 16 pages.
Office Action for Chinese Application No. 202080095993.9 mailed on Oct. 7, 2023, with its English Translation, 24 pages.
Office Action for European Patent Application No. 20 841 893.9 mailed Sep. 3, 2024, and its English translation, 8 pages.
Office Action for Japan Patent Application No. 2022-537653, mailed Dec. 10, 2024, and its English translation, 14 pages.

* cited by examiner

HOLDING SYSTEM FOR HOLDING SUBSTRATES DURING A PROCESSING OF THE SURFACES OF THE SUBSTRATES

The present invention relates to a holding system for holding substrates (e.g., workpieces or tools), in particular for processing surfaces of the substrates in a surface treatment system, and to a method for using the holding system.

Particularly when machining elongated substrates (e.g. tools of the shank tool type or workpieces that have a similar shape to shank tools), the transport and holding processes take up a significant part of the overall effort of the machining processes concerned. In such machining processes, the substrates to be machined are commonly transported via specifically designed/configured transport systems and delivered in holding systems prior to machining. Before surface treatment, the substrates to be treated are also usually first manually re-batched before being placed individually in carriers in a surface treatment system. For certain processes, for example, the individual substrates have to be held upside down or horizontally. After processing, the substrates are usually re-batched manually again before being shipped. This entire process chain not only means high handling costs, but at the same time involves the risk of damage to the substrates being processed, which in turn leads to higher production costs. The handling effort and the associated risk of damage are particularly high when processing filigree substrates.

It is therefore the object of the present invention to at least partially eliminate the aforementioned disadvantages of known devices and systems for fixing and holding substrates, in particular workpieces and/or elongated shaped tools. In particular, it is the object of the invention to provide a device and a system for holding substrates which, in a simple and inexpensive manner, enable stable fixation and safe and simple transport of the substrates before, during and after a machining operation and thus minimize the handling effort in the overall machining process chain.

The above object is solved by a holding system with the features of the independent system claim and a method with the features of the independent method claim. Further features and details of the invention result from the respective dependent claims, the description and the drawings. Features and details which are described in connection with the holding system according to the invention naturally also apply in connection with the method according to the invention and vice versa in each case, so that with regard to the disclosure concerning the individual aspects of the invention reference is or can always be made mutually.

According to the invention, a holding system for holding substrates is provided for use in a surface treatment system. In this case, the holding system has a covering area and further comprises a plurality of fixing elements, a body arranged within the covering area for receiving the fixing elements, and a positioning element for setting the covering area and a machining area, wherein a plurality of substrates can be fixed by the fixing elements and processed within the machining area.

Thus, the holding system according to the invention is designed/configured to fix substrates to be processed during processing and to shield a part of the substrates so that a part of the substrates is not accessible for processing and the remaining part of the substrates is released for processing. According to the invention, the positioning element preferably serves to set or release a machining area. In particular, the positioning element can be rotatably mounted within the holding system and, in addition to varying a positioning in the longitudinal extension of the holding system, can preferably enable a change in a positioning transverse to the longitudinal extension of the holding system.

The processing of the substrates takes place in the machining area in question—which does not project into the cover area. The body of the holding system according to the invention preferably has a plurality of recesses arranged next to one another for the implementation of the fixing elements, which can advantageously be formed in the form of bores or the like and in particular can be arranged circularly within the body. By means of a force-fitting fixing via the fixing elements in question, the holding system is here preferably designed in such a way that substrates can be rotated by at least 90°, in particular by at least 180°, during processing. It is understood that the substrates can also be rotated through angles smaller than 90° or larger than 180°. It is also understood that the substrates can preferably be rotated about more than one axis, in particular about three axes x, y, z, during processing.

For fixing the substrates to be processed, the fixing elements can preferably have a fixing area. By means of this fixing area, the substrates can advantageously be force-fitted during processing. The fixing area can be locally restricted with respect to the entire surface or the entire volume of the fixing elements. Advantageously, the fixing area can be arranged between a first recess for the passage of a substrate and a second recess for the passage of the substrate. Advantageously, the fixing elements can be formed in this case in such a way that they have a varying diameter in the longitudinal extension. Along the longitudinal extension of the fixing elements, the diameter can, for example, decrease in each case from the outer sides towards the center, with the diameter in the fixing area preferably being the smallest. To ensure the greatest possible flexibility with regard to the diameter of the substrates to be accommodated and fixed, the fixing elements can also advantageously have a part-circular cross section at least in sections.

Within the scope of the invention, it has been recognized that a fixing element designed/configured according to the invention can be used to fix a substrate, in particular a workpiece, in a simple manner, the fixing allowing particularly simple transport, in particular simple handling of the substrate before, during and after a processing operation, and the substrate being able to be handled, for example, rotated or upside down during a processing operation.

With regard to secure fixing and at the same time the most accurate possible machining of substrates, in particular tools to be machined, such as shank tools, it can be advantageous for the cover area to have a greater longitudinal extension than the machining area, preferably at least twice the longitudinal extension, in particular at least three times the longitudinal extension.

With regard to a design/configuration that is as compact as possible and, at the same time, a holding force that is as precisely definable as possible, it is also conceivable that the body is cylindrical, with the height of the cylinder preferably having at least the same length as the fixing elements arranged within the body. In this way, the fixing elements can be arranged completely within the body.

Within the scope of a constructively simple possibility of ensuring an adjustable machining area, it can be advantageously provided according to the invention that the positioning element has a disc-shaped first part for separating the cover area from the machining area and a second bolt-shaped part for positioning the first part. In this case, the second part can preferably be fastened to the body and, for example, be of spherical design/configuration, so that positioning of the first part can be carried out in a simple manner, for example, via a threaded rod or the like. Within the framework of a stable and robust design/configuration of the present holding system, it can also be provided that the positioning element is of monolithic design/configuration, wherein the first and second parts can be formed in one piece from a materially uniform component.

With regard to a structurally simple possibility of separating a machining area from a covering area while at the same time ensuring access of the substrates to the machining area, it can be further provided that the positioning element has a plurality of recesses for the passage of one substrate each, the recesses preferably being arranged in the first part. In this case, the recesses can preferably be in the form of holes and advantageously be arranged in a circle within the first part of the positioning element, in particular corresponding to the arrangement of recesses within the body.

In order not to change a positioning of the machining area during a processing of substrates, it is particularly conceivable that an anti-rotation element is provided for preventing an unintentional rotation about the axis of rotation, wherein the anti-rotation element can be firmly connected to the body and the positioning element in order to prevent an unintentional rotation of the positioning element.

In a structurally simple design/configuration, it can be provided here that the anti-rotation element is formed in the form of a securing pin, which can be fixed at its first end preferably by a fixing element within the body and can be fixed firmly to the positioning element, in particular firmly to the first part of the positioning element, via another end in order to prevent unintentional rotation of the positioning element. A connection between the locking pin and the first part of the positioning element can also be made here in a force-fitting manner, preferably via a plug-in connection, latching connection or screw connection or the like.

In the context of a safe and stable guiding of substrates during a processing, it is further conceivable that at least one guiding element is provided for guiding the substrates, wherein the guiding element is preferably arranged between the body and the first part of the positioning element.

Within the scope of a structurally simple design/configuration of a safe and stable guidance of the substrates during processing, it can be provided according to the invention that the guide element has a plurality of recesses for the passage of one substrate each, wherein the recesses are preferably arranged corresponding to the arrangement of the recesses within the body and/or to the arrangement of the recesses within the first part of the positioning element.

In this case, the guide element can be designed/configured in particular in the form of a disc or cylindrically or the like.

In the context of simple transport or simple positioning of the substrates during processing, it can also be advantageously provided that at least one connecting element is provided for connecting the holding system to a movement unit, wherein the connecting element is preferably cylindrical and in particular is arranged directly on the body. In this case, the connecting element can preferably be designed/configured in the form of a flange or the like, which is connected to the body of the retaining system in a material bonding, force-fitting or form-fitting manner. The connecting element can thereby advantageously be arranged in a gripping area at which the holding system can be gripped by a movement unit for exerting a translatory and rotatory movement. In order to ensure a simple connection to the movement unit, it can advantageously also be provided that the connecting element comprises connecting means/elements, such as sleeves, hooks, threads, holding magnets or the like, for connection to the movement unit. In addition to a first connecting element, further connecting elements, preferably of flange-like design/configuration, may furthermore be provided for arrangement in a gripping area.

In order to enable non-destructive and contamination-free transport of the substrates to be processed, it may further be advantageous that at least one covering means/elements is provided for covering the machining area, the covering means/elements preferably being in the form of a cover cap or the like.

Within the scope of a structurally simple design/configuration and a simultaneously reliable fixing of the substrates by means of the present holding system, the fixing elements arranged within the holding system can advantageously have an upper part-circular section for the passage of a substrate and/or a lower part-circular section arranged opposite the upper section for the passage of a substrate and/or a fixing area arranged between the upper and lower sections for the force-fitting fixing of the substrate, wherein the fixing area is preferably formed in the shape of a waist and has a waist which is arranged in particular between the upper and lower sections, so that the diameter of the fixing area decreases from the upper section towards the waist and the diameter of the fixing area decreases from the lower section towards the waist. The present fixing elements can preferably be provided for the fixing, particularly preferably for the force-fitting fixation, of substrates to be machined, in particular elongated substrates, for example filigree tools to be machined, such as shank tools or milling tools, drill heads or the like. The term part-circular is intended to be understood more broadly in the context of the invention, in particular, so that this term is understood to include not only the parts of an ideal circle, but also the parts of a non-ideal circle, for example a compressed or stretched circle. In the context of the invention, the term a force-fitting fixation is further preferably understood to mean a clamping. The term of a force-fitting fixing can also be understood more broadly in the context of the invention, so that this term can also be understood to include at least partially form-fitting types of connection. Such an embodiment of the fixing elements according to the invention enables, in particular, a great flexibility with respect to the diameter of the substrates to be accommodated. In this respect, the fixing elements can also be designed in particular to be interchangeable and thus be adaptable in a targeted manner with regard to the diameter or the shape of the substrates to be processed.

Within the scope of the most compact possible design/configuration and the greatest possible utilization of a fixing force, it can be advantageously provided that the waist of the fixing elements is arranged centrally between the upper and lower sections. In the context of the invention, a central arrangement is understood to mean in particular that the waist is at the same distance from the upper and lower sections. The waist, or the waisted section, in this case preferably has the same diameter along its longitudinal extension. Here, the waist or the waisted area can preferably represent the center of the fixing area for fixing a substrate. It is conceivable that the waisted area covers a small or narrow or also a larger section of the fixing element.

In order to enable flexible force-fit fixation of different substrates of different diameters, it can be provided in accordance with the invention, in particular, that a recess arranged longitudinally along the fixing elements is provided, the recess preferably completely severing the fixing elements along a longitudinal extension, so that the recess completely severed both the upper and lower sections and the fixing area, the width of the recess in particular being smallest along the waist and increasing in the direction of the upper and lower sections. Preferably, the recess is so large in this case that the two end sections separated by the recess do not touch each other without exerting force on the fixing element. It is also conceivable that the recess only partially cuts through the fixing elements along a longitudinal extension.

With regard to a precisely adjustable and adaptable force for the force-fitting fixing of substrates, it can also be provided that the fixing area of the fixing elements has a plurality of lamellae, with an inner recess preferably being arranged between two lamellae in each case. The length and width of the lamellae can preferably be formed in a manner comparable to the length and width of the recesses arranged between two lamellae. Advantageously, the width of the lamellae can be somewhat greater than the width of the recesses, in particular at least 15% of the width of the recesses can be wider.

Here, it is also conceivable that the number of lamellae correlates with the diameter along the waist, with at least two lamellae, in particular at least three lamellae, preferably being provided per millimeter of diameter along the waist.

In the context of a compact arrangement and a simultaneously effective force-fitting fixation of substrates, it can be further provided that the diameter along the waist is at least less than 80% of the diameter along the upper and/or lower section, preferably at least less than 75% of the diameter along the upper and/or lower section, in particular at least less than 70% of the diameter along the upper and/or lower section.

Here, the diameter along the waist can be between 2 cm and 0.2 mm, preferably between 1 cm and 0.5 mm, in particular between 0.5 cm and 1 mm. In the context of an exact adaptation to specific substrates, the diameter along the waist can also be, for example, 2.34 mm, 2.5 mm, 3 mm, 4 mm, 5 mm or 6 mm.

With regard to ensuring consistent fixing properties even under different machining conditions, it can be advantageously provided that the fixing elements are formed at least partially from a temperature-resistant and corrosion-resistant material, preferably at least partially from a nickel-chromium alloy, for example Nimonic® (e.g. Nimonic90®) or Inconel® (e.g. InconelX750®). In the context of the invention, a temperature-resistant material is understood to mean, in particular, a material with a melting point above 1200° C. Furthermore, the material can preferably also be used at extremely low pressures and is still temperature-stable, so that the material can preferably still be stable up to at least 650° C. at pressures below $10^{-6}$ bar. By a corrosion-resistant material is meant in particular a material with a corrosion rate under standard conditions of less than 0.001 mm/year. With regard to a material which is particularly resistant to temperature and corrosion, the material may also contain, in addition to nickel and chromium, preferably as minor constituents, aluminum and/or titanium and/or iron and/or molybdenum and/or niobium and/or cobalt and/or manganese and/or copper and/or aluminum and/or silicon and/or carbon and/or sulfur and/or phosphorus and/or boron. The fixing elements can here either be made entirely of the temperature- and corrosion-resistant material or merely provided with a temperature- and corrosion-resistant coating.

With regard to a secure and stable, but at the same time non-destructive force-fitting fixation, according to the invention it can be provided in particular that the fixing elements are designed/configured in such a way that substrates can be fixed with a pull-off force of 2-6.1 N, preferably with a pull-off force of 2.5-3.5 N.

With regard to a structurally simple and surface-friendly fixing of the substrates, it can also be provided according to the invention that the fixing elements are formed in the form of spring elements. In the context of the invention, a spring element is understood to mean in particular an element with an at least partially elastic effect. The elastic effect can preferably be exerted in the waist area.

It is also an object of the invention to provide a method for processing substrates, preferably using a holding system described above. Here, the method according to the invention comprises the steps/stages of introducing a plurality of substrates into a holding system and positioning the substrates by means of a positioning element within a covering and a machining area of the holding system. Thus, the method according to the invention has the same advantages as have already been described in detail with respect to the holding system according to the invention. Processing of the subject substrates can preferably take the form of surface processing, for example in the form of coatings or the like.

With regard to effective processing, it can also be provided in particular that the substrate is rotated by at least 90°, preferably by at least 180°, during processing. By ensuring fixation via the fixing elements, this allows, for example, "overhead storage" of the substrates during processing.

Further advantages, features and details of the invention will be apparent from the following description, in which embodiments of the invention are described in detail with reference to the drawings. In this connection, the features mentioned in the claims and in the description may each be essential to the invention individually or in any combination.

Figure 2:
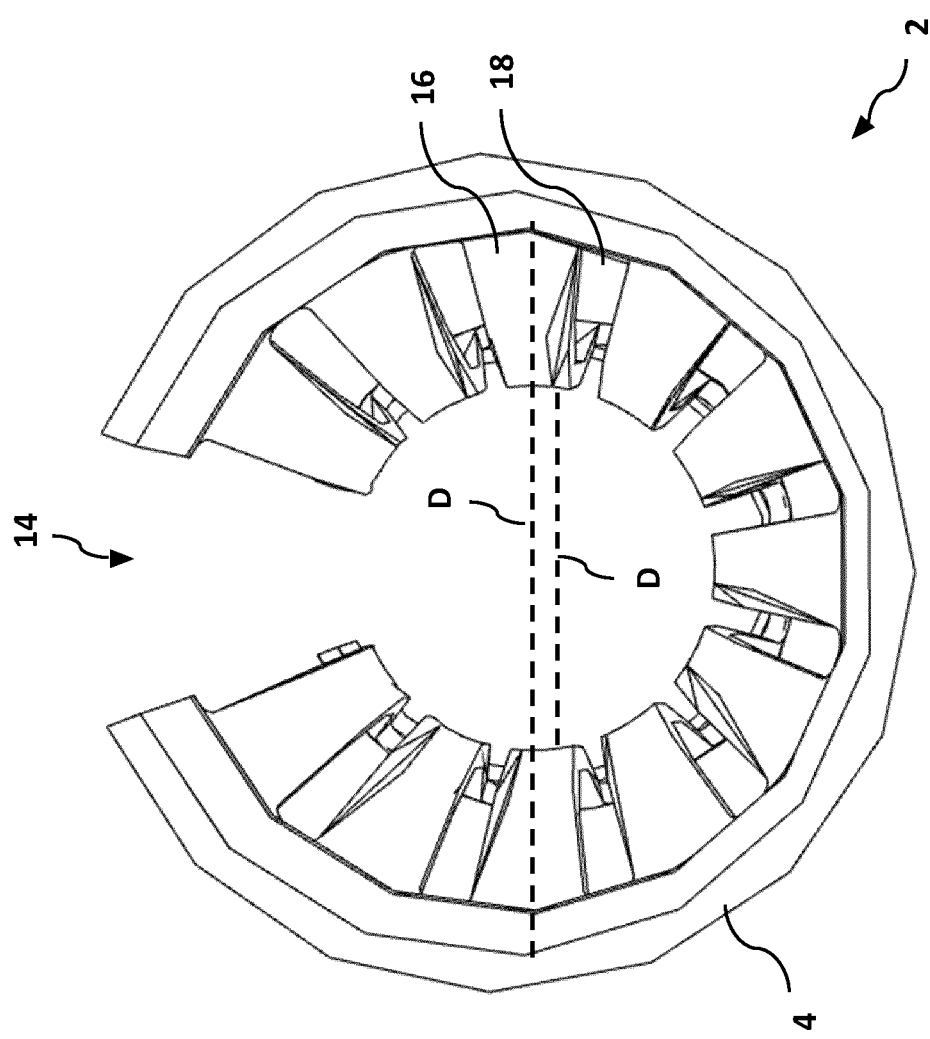
Figure 3:
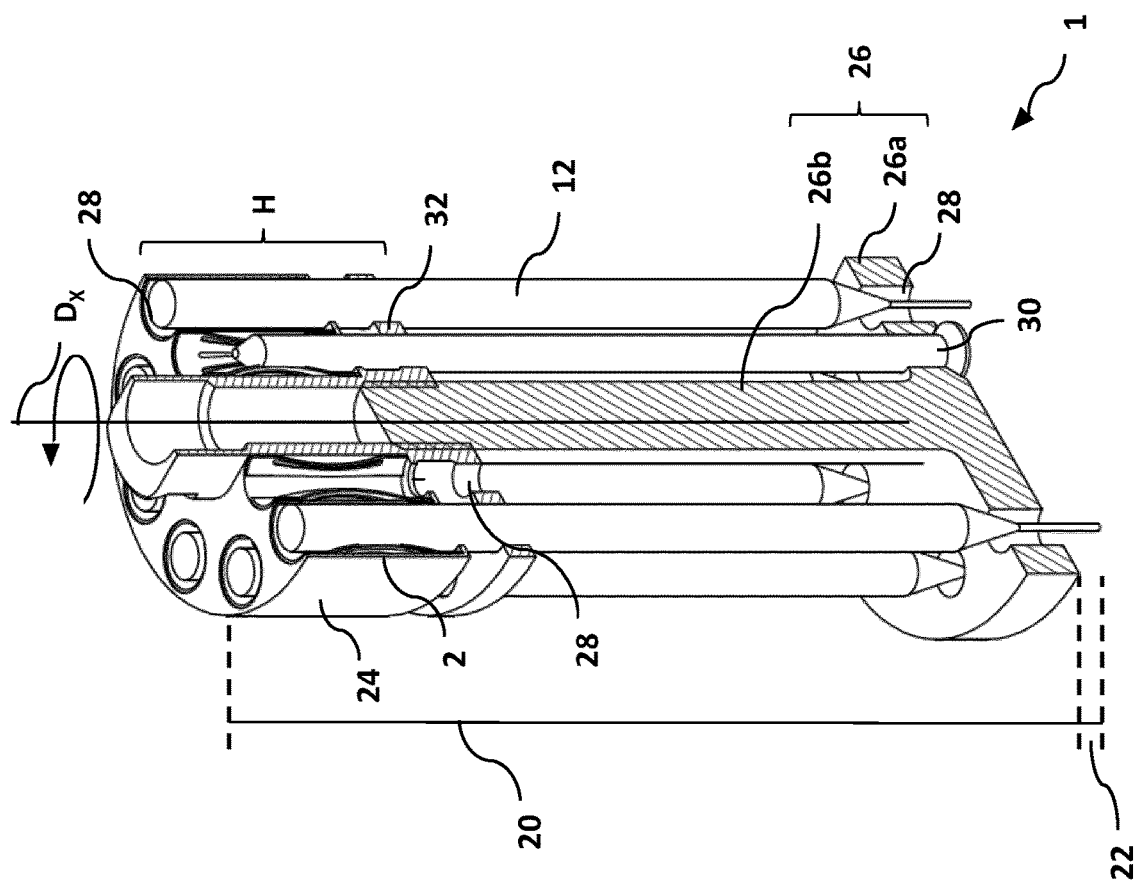
Figure 4:
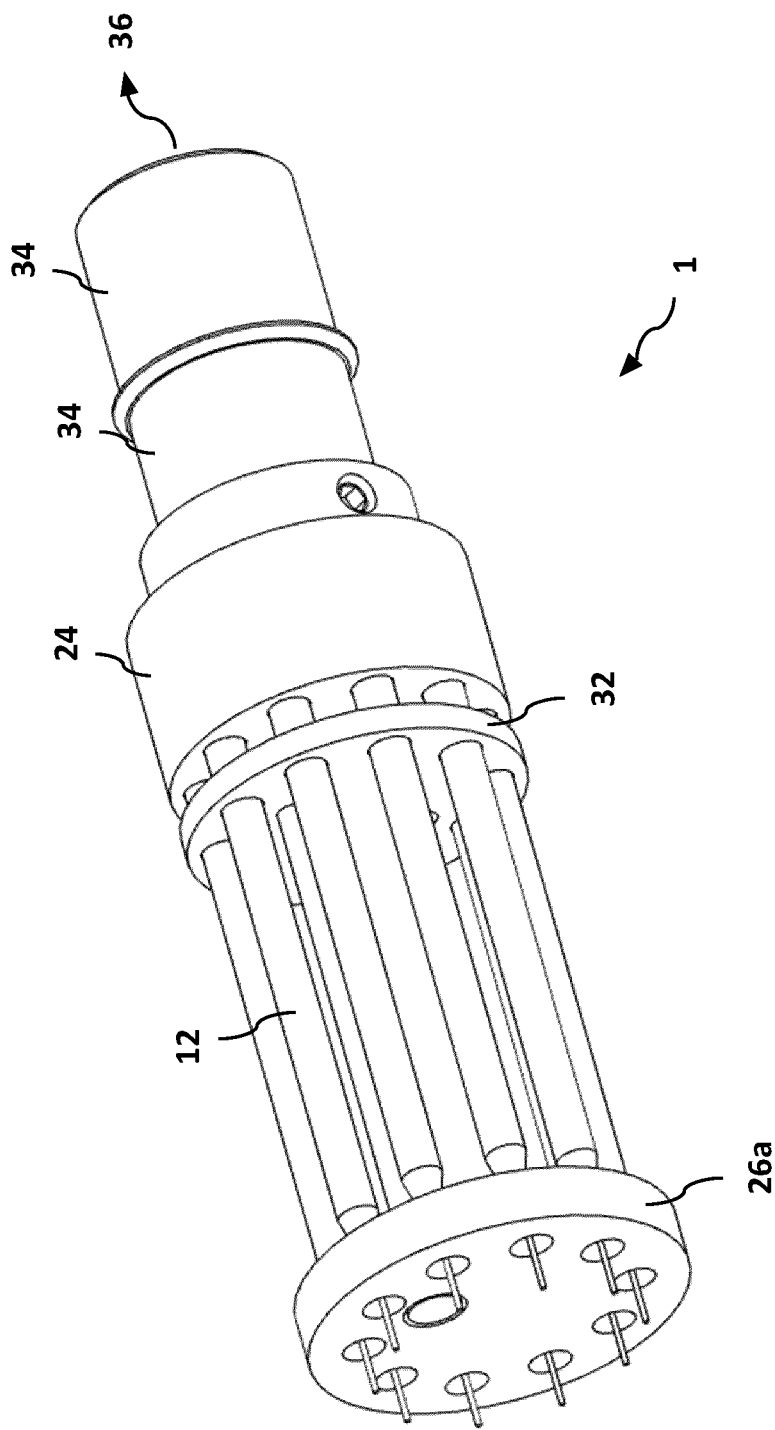
Figure 5:
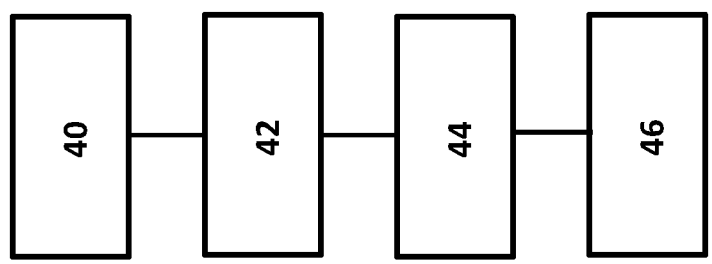

It shows:

FIG. 1 *a,b* a schematic representation of a fixing element according to the invention for fixing a substrate for use in a holding system of a surface treatment system in a front view (a) and a rear view (b), FIG. 2 a schematic representation of a fixing element according to the invention for fixing a substrate for use in a holding system for use in a surface treatment system in a plan view, FIG. 3 a schematic representation of a holding system according to the invention for holding substrates in a sectional view, FIG. 4 a schematic representation of a holding system according to the invention for holding substrates in a spatial representation, FIG. 5 a schematic representation of the individual steps of a method for processing substrates according to the invention.

FIG. 1 *a,b* shows a schematic representation of a fixing element 2 according to the invention for fixing a substrate 12 for use in a holding system 1 in a front view (a) and a rear view (b).

The fixing element 2 comprises an upper semi-circular section 4 for the passage of the substrate 12, a lower part-circular section 6 arranged opposite the upper semi-circular section 4 for the passage of the substrate 12, and a fixing area 8 arranged between the upper and lower sections 4, 6 for the force-fit fixing of the substrate 12. In this case, the fixing area 8 is formed in the shape of a waist and has a waist 10 which is arranged between the upper and lower sections 4, 6, so that the diameter D of the fixing area 8 decreases from the upper section 4 towards the waist 10 and the lower diameter D of the fixing area 8 decreases from the lower section 6 towards the waist 10.

As can be seen in the present case, the waist 10 of the fixing element 2 is arranged centrally between the upper and lower sections 4, 6.

Furthermore, it can be seen that the fixing element 2 has a recess 14 arranged on the longitudinal side, which completely cuts through the fixing element 2 along a longitudinal extension L, so that the recess 14 completely cuts through both the upper and lower sections 4, 6, and the fixing area 8. Here, the width of the recess 14 is smallest along the waist 10 and increases towards the upper and lower sections 4, 6.

Furthermore, it can be seen that the fixing area 8 has a plurality of lamellae 16, with an inner recess 18 being arranged between each two lamellae 16. This structure serves in particular to provide a precisely adjustable and adaptable force for the force-fit fixation of substrates 12. The number of lamellae 16 can correlate here in particular with the diameter D along the waist 10.

FIG. 2 shows a schematic representation of a fixing element 2 according to the invention for fixing a substrate 12 for use in a holding system 1 in a plan view.

According to this top view of the upper part-circular section 4 for the passage of a substrate 12, the recess 14 as well as the individual lamellae 16 with inner recesses 18 arranged between the lamellae 16 can once again be seen clearly. Furthermore, it can be seen that the inner diameter D along the waist 10 is significantly smaller than the diameter D along the opening of the upper semi-circular section 4.

FIG. 3 shows a schematic representation of a holding system 1 according to the invention for holding substrates 12 in a sectional view.

Here, the holding system 1 according to the invention has a covering area 20 and comprises a plurality of fixing elements 2 described above, a body 24 arranged within the covering area 20 for receiving the fixing elements 2, and a positioning element 26 for adjusting the covering area 20 and the machining area 22. Here, a plurality of substrates 12 are fixed by the fixing elements 2 and can be processed within the machining area 22.

As can be seen in the present case, the covering area 20 has a greater longitudinal extension than the machining area 22. It is understood that the covering area 20 can also have a smaller longitudinal extension than the machining area 22. Furthermore, the body 24 has a cylindrical shape, which in the present case has approximately the same length as the fixing elements 2 arranged inside the body 24.

The positioning element 26 further comprises a disc-shaped first part 26a for separating the covering area 20 from the machining area 22, and a bolt-shaped second part 26b for positioning the disc shaped first part 26a. Further, the positioning member 26 comprises a plurality of recesses 28 for passing a respective substrate 12 therethrough, the recesses 28 being presently disposed in the disc shaped first part 26a.

In addition, as can be seen in the present case, the holding system 1 comprises an anti-rotation element 30 for preventing unintentional rotation about the axis of rotation $D_x$, which in the present case is fixedly connected to the body 24 and the positioning element 26 in order to prevent unintentional rotation of the positioning element 26 during processing of substrates 12.

Furthermore, the holding system 1 comprises a guide element 32 for guiding substrates 12, which in the present case is arranged between the body 24 and the disc shaped first part 26a of the positioning element 26 and likewise has a plurality of recesses 28 for the passage of a substrate 12 in each case. The recesses 28 are arranged here corresponding to the arrangement of the recesses 28 within the body 24 and to the arrangement of the recesses 28 within the disc shaped first part 26a of the positioning element 26.

FIG. 4 shows a schematic representation of a holding system 1 according to the invention for holding substrates 12 in a spatial representation. In this spatial representation, the arrangement of a connecting element 34 for connecting the holding system 1 to a movement unit 36 can also be seen. In the present case, the connecting element 34 is also cylindrical in shape and is arranged directly on the body 24 of the holding system 1. Via the connecting element 34, the holding system 1 can advantageously be gripped by a movement unit 36 for exerting a translatory and rotatory movement in order to enable easy transport or processing of substrates 12 arranged within the holding system 1.

FIG. 5 shows a schematic representation of the individual steps/stages of a method for processing substrates 12 according to the invention.

Here, the method for processing substrates 12 comprises the steps of introducing 40 a plurality of substrates 12 into a holding system 1 and positioning the substrates 42 by means of a positioning element 24 within a covering and the machining area 20, 22 of the holding system 1, as well as the additional optional steps/stages of processing 44 the substrates 12 within the machining area 22 and post-processing 46 the substrates 12. As possible processing methods, surface processing methods, for example abrasive, chemical, thermal, electrolytic or similar surface processing methods can preferably be provided.

According to the method according to the invention, it can be provided in particular that the substrate 12 is rotated by at least 90°, preferably by at least 180°, during processing.

By means of the holding system 1 according to the invention and the method for using a holding system 1 according to the invention, it is in particular possible to achieve a fixation of a substrate 12, in particular of a workpiece, such as a tool to be machined, in a simple manner, wherein the fixation allows a particularly simple transport, in particular a simple handling of the substrate 12 before, during and after a machining operation, and the substrate 12 can be handled, for example, rotated or upside down during a machining operation by means of the present fixation.

LIST OF REFERENCE SIGNS

1 Holding system
2 Fixing element
4 Upper semi-circular section
6 Lower semi-circular section
8 Fixing area
10 Waist
12 Substrate
14 Recess
16 Lamellae
18 Inner recess
20 Covering area
22 Machining area
24 Body
26 Positioning element
26a Disc shaped first part
26b Bolt-shaped second part
28 Recesses for the passage of substrates
30 Anti-rotation element
32 Guide element
34 Connecting element
36 Movement unit
40 Introducing a plurality of substrates
42 Positioning the substrates
44 Processing the substrates 46 Post-processing the substrates
D Diameter
L Longitudinal extension
H Height
$D_x$ Rotation axis

The invention claimed is:

1. A holding system for holding substrates for use in a surface treatment system having a cover area, comprising,
a plurality of fixing elements,
a body arranged within the cover area for receiving the fixing elements,
a positioning element for adjusting the covering area and a machining area,
wherein a plurality of the substrates can be fixed by the fixing elements and processed within the machining area.

2. The holding system according to claim 1, wherein the positioning element comprises a disc-shaped first part for separating the cover area from the machining area and a bolt-shaped second part for positioning the disc-shaped first part.

3. The holding system according to claim 1, wherein the positioning element has a plurality of recesses for the feedthrough of a respective substrate.

4. The holding system according to claim 1, wherein an anti-rotation element is provided for preventing unintentional rotation about an axis of rotation, the anti-rotation element is connected fixedly to the body and to the positioning element in order to prevent unintentional rotation of the positioning element.

5. The holding system according to claim 4, wherein the anti-rotation element is formed in the form of a securing pin which can be fixed at its first end within the body and can be firmly connected via its other end to the positioning element.

6. The holding system according to claim 1, wherein at least one guide element is provided for guiding substrates.

7. The holding system according to claim 6, wherein the guide element has a plurality of recesses for the feedthrough of a respective substrate.

8. The holding system according to claim 1, wherein at least one connecting element is provided for connection to a movement unit.

9. The holding system according to claim 1, wherein the fixing elements have a fixing area for force-fit fixing of the substrates, the fixing area being configured in the form of a locally limited sub-area.

10. The holding system according to claim 1, wherein the fixing elements are configured in such a way that the substrates can be rotated by at least 90°, about one or more axes x, y, z by means of force-fitting fixing by the fixing elements during processing.

11. The holding system according to claim 1, wherein the fixing elements have at least an upper part-circular section for the feedthrough of the substrate or a lower part-circular section, arranged at least opposite the upper section, for the feedthrough of the substrate or a fixing area, arranged between the upper and lower sections, for the force-fitting fixing of the substrate.

12. The holding system according to claim 11, wherein a waist of the fixing elements is arranged centrally between the upper and lower sections.

13. The holding system according to claim 11, wherein a recess arranged longitudinally along the fixing elements is provided.

14. The holding system according to claim 11, wherein the fixing area of the fixing elements has a plurality of lamellae.

15. The holding system according to claim 14, wherein the number of lamellae correlates with the diameter along a waist of the fixing elements.

16. The holding system according to claim 15, wherein the diameter along the waist is at least less than 80% of the diameter along the upper or lower section.

17. The holding system according to claim 11, wherein the fixing elements are formed at least partially from a temperature-resistant and corrosion-resistant material.

18. The holding system according to claim 11, wherein the fixing elements are designed in such a way that substrates can be fixed with a pull-off force of 2 to 6.1 N.

19. The holding system according to claim 11, wherein the fixing elements are formed in the form of spring elements.

* * * * *